(12) United States Patent
Choi et al.

(10) Patent No.: US 12,638,484 B2
(45) Date of Patent: May 26, 2026

(54) CLOCK MONITORING CIRCUIT

(71) Applicant: SAMSUNG ELECTRONICS CO., LTD., Suwon-si (KR)

(72) Inventors: Haejung Choi, Suwon-si (KR); Youngbin Kwon, Suwon-si (KR); Donghun Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 222 days.

(21) Appl. No.: 18/523,269

(22) Filed: Nov. 29, 2023

(65) Prior Publication Data

US 2024/0183901 A1     Jun. 6, 2024

(30) Foreign Application Priority Data

Dec. 5, 2022     (KR) ........................ 10-2022-0168096

(51) Int. Cl.
| | |
|---|---|
| *G01R 23/10* | (2006.01) |
| *G01R 23/00* | (2006.01) |
| *G01R 31/317* | (2006.01) |
| *H03K 5/19* | (2006.01) |
| *H03K 5/26* | (2006.01) |

(52) U.S. Cl.
CPC ........... *G01R 23/10* (2013.01); *G01R 23/005* (2013.01); *G01R 31/31727* (2013.01); *H03K 5/19* (2013.01); *H03K 5/26* (2013.01)

(58) Field of Classification Search
None
See application file for complete search history.

(56) References Cited

U.S. PATENT DOCUMENTS

| | | | | | |
|---|---|---|---|---|---|
| 5,867,041 | A | * | 2/1999 | Ha ........................ | H04J 3/0688 |
| | | | | | 327/20 |
| 5,946,362 | A | * | 8/1999 | Ha ........................ | H04J 3/0688 |
| | | | | | 375/357 |
| 6,333,646 | B1 | | 12/2001 | Tsuzuki | |
| 6,834,093 | B1 | | 12/2004 | Chiu | |
| 7,529,961 | B2 | * | 5/2009 | Kondou .................... | G06F 1/04 |
| | | | | | 714/48 |
| 7,801,259 | B2 | | 9/2010 | Sung et al. | |
| 8,314,652 | B2 | | 11/2012 | Kuo et al. | |
| 8,937,496 | B1 | * | 1/2015 | Ahmad .................... | H03K 5/19 |
| | | | | | 327/39 |

(Continued)

FOREIGN PATENT DOCUMENTS

| | | |
|---|---|---|
| JP | 7-235831 A | 9/1995 |
| JP | 2010-206723 A | 9/2010 |
| KR | 10-0658354 B1 | 12/2006 |

OTHER PUBLICATIONS

Communication issued May 7, 2024 by the European Patent Office in European Patent Application No. 23213915.4.

*Primary Examiner* — Thomas J. Hiltunen
(74) *Attorney, Agent, or Firm* — Sughrue Mion, PLLC

(57) ABSTRACT

A clock monitoring circuit includes a clock enable signal generator configured to generate an ultra-high frequency clock enable signal based on a clock enable control signal and a reference clock signal, and an ultra-high frequency detector configured to generate an ultra-high frequency determination signal indicating whether a selection clock signal is an ultra-high frequency signal, based on the selection clock signal, the ultra-high frequency clock enable signal, and the reference clock signal.

7 Claims, 12 Drawing Sheets

(56)         References Cited

U.S. PATENT DOCUMENTS

| 8,970,254 | B1 |  | 3/2015 | Murphy et al. | |
|---|---|---|---|---|---|
| 9,391,615 | B2 |  | 7/2016 | Shin et al. | |
| 10,236,042 | B2 |  | 3/2019 | Eaton et al. | |
| 10,749,510 | B2 | * | 8/2020 | Kubota | H03K 21/026 |
| 11,333,693 | B2 | * | 5/2022 | Hashimoto | H03K 21/40 |
| 12,174,658 | B2 | * | 12/2024 | Ghotgalkar | H03K 5/135 |
| 2014/0266355 | A1 |  | 9/2014 | Park et al. | |
| 2016/0065215 | A1 |  | 3/2016 | Shin et al. | |
| 2021/0263550 | A1 |  | 8/2021 | Noh et al. | |

* cited by examiner

FIG. 9

CLOCK MONITORING CIRCUIT

CROSS-REFERENCE TO RELATED APPLICATION

This application is based on and claims priority under 35 U.S.C. § 119 to Korean Patent Application No. 10-2022-0168096, filed on Dec. 5, 2022, in the Korean Intellectual Property Office, the disclosures of which are incorporated by reference herein in their entirety.

BACKGROUND

The present disclosure relates to a clock monitoring circuit, and more particularly, to a clock monitoring circuit by which various types of frequency defects may be detected.

Clock signals are signals used to control operation timings of components operating within electronic devices. Clock signals are used as basic signals for all operations by electronic devices.

For electronic devices to perform normal operations, there have been requirements for clock signals having frequencies within appropriate ranges for operations of electronic devices. For example, a clock signal having a high frequency is required for prompt operation of electronic devices. Here, when the clock signal does not have the frequency required by electronic devices, the electronic devices may misoperate. To prevent such misoperation of electronic devices, development on a method of monitoring whether clock signals are defective is required. A clock signal of an incorrect frequency may also referred to as clock signal with an abnormal frequency.

SUMMARY

One or more embodiments provide a clock monitoring circuit by which various kinds of frequency defects may be detected.

According to an aspect of an embodiment, there is provided a clock monitoring circuit configured to monitor a selection clock signal, the clock monitoring circuit including a clock enable signal generator configured to generate an ultra-high frequency clock enable signal, based on a clock enable control signal and a reference clock signal, and an ultra-high frequency detector configured to generate an ultra-high frequency determination signal indicating whether the selection clock signal is an ultra-high frequency signal, based on the selection clock signal, the ultra-high frequency clock enable signal and the reference clock signal.

According to an aspect of an embodiment, there is provided a clock monitoring circuit configured to monitor a selection clock circuit, the clock monitoring circuit including: a clock enable signal generator configured to generate a high-frequency clock enable signal based on a clock enable control signal and a reference clock signal; a high-frequency detector configured to generate a high-frequency count value by counting a selection clock signal received from the selection clock circuit, wherein the counting is based on the high-frequency clock enable signal; and a random frequency detector configured to generate a random frequency determination signal indicating whether frequency shift occurred to the selection clock signal, based on the high-frequency clock enable signal and the high-frequency count value.

According to another aspect of an embodiment, there is provided a clock monitoring circuit configured to monitor a selection clock signal, the clock monitoring circuit including a clock enable signal generator configured to generate a high-frequency clock enable signal, a low-frequency clock enable signal, and an ultra-high frequency clock enable signal, based on a clock enable control signal and a reference clock signal, a high-frequency detector configured to generate a high-frequency count value by counting the selection clock signal based on the high-frequency clock enable signal and generate a high-frequency determination signal indicating whether the selection clock signal is a high-frequency signal, based on the high-frequency count value, a low-frequency detector configured to generate a low-frequency count value by counting the selection clock signal based on the low-frequency clock enable signal and generate a low-frequency determination signal indicating whether the selection clock signal is a low-frequency signal based on the low-frequency count value, an ultra-high frequency detector configured to generate an ultra-high frequency determination signal indicating whether the selection clock signal is an ultra-high frequency signal, based on the selection clock signal, the ultra-high frequency clock enable signal and the reference clock signal, and a random frequency detector configured to generate a random frequency determination signal indicating whether frequency shift has occurred to the selection clock signal, based on the high-frequency clock enable signal and the high-frequency count value.

BRIEF DESCRIPTION OF THE DRAWINGS

The above and/or other aspects will be more clearly understood from the following detailed description of embodiments taken in conjunction with the accompanying drawings in which:

FIG. 9 is a block diagram of a clock monitoring circuit according to another embodiment;

DETAILED DESCRIPTION

Hereinafter, one or more embodiments will be described in detail with reference to the accompanying drawings.

Figure 1:
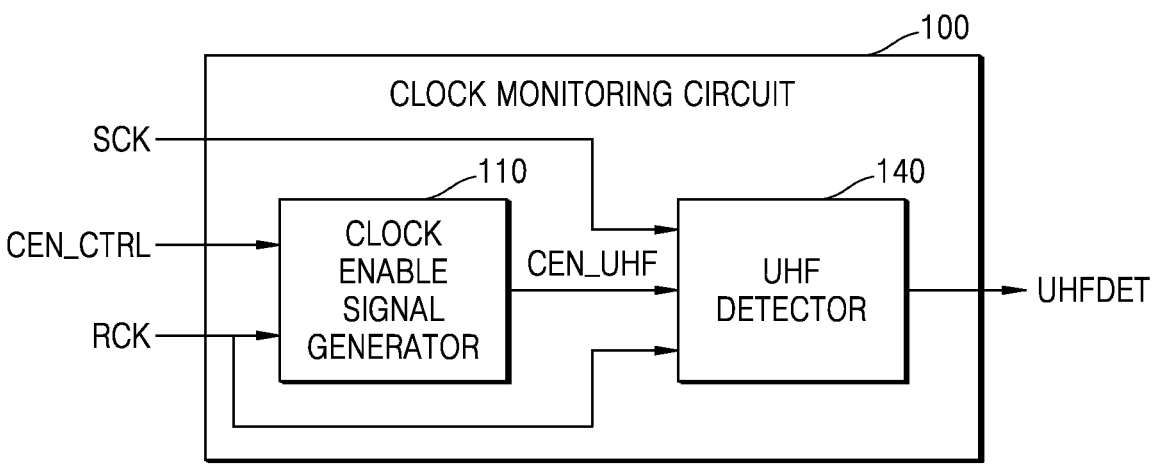
FIG. 1 is a block diagram of a clock monitoring circuit according to an embodiment.

FIG. 1 is a block diagram of a clock monitoring circuit 100 according to an embodiment.

Referring to FIG. 1, the clock monitoring circuit 100 according to an embodiment may include a clock enable signal generator 110 and an ultra-high frequency detector 140.

The clock monitoring circuit 100 may be included in an electronic device. The clock monitoring circuit 100 may monitor a selection clock signal SCK that is any one signal selected from among clock signals used by the electronic device. The clock monitoring circuit 100 may monitor the selection clock signal SCK to determine whether a frequency of the selection clock signal SCK is defective, and may generate and output a signal according to a result obtained by the determination.

In an embodiment, when the frequency of the selection clock signal SCK is within a preset normal frequency range and there is no frequency shift in the selection clock signal SCK, the clock monitoring circuit 100 may determine that the frequency of the selection clock signal SCK is not defective.

The normal frequency range may indicate a frequency range required for the selection clock signal SCK for normal operations of the electronic device. Hereinafter, when the selection clock signal SCK is a low-frequency signal, it may indicate that a frequency of the selection clock signal SCK is under the normal frequency range. In addition, when the selection clock signal SCK is a high-frequency signal, it may indicate that a frequency of the selection clock signal SCK is above the normal frequency range. In addition, when the selection clock signal SCK is an ultra-high frequency signal, it may indicate that the frequency of the selection clock signal SCK is higher than the high-frequency signal, and generally, among the high-frequency signals, signals having frequencies of 3 GHz or higher may be referred to as an ultra-high frequency signal.

The frequency shift may indicate a change in the frequency of the selection clock signal SCK from a normal frequency to another arbitrary frequency, and a signal in which the frequency shift has occurred may be referred to as a random frequency signal.

In an embodiment, when the frequency of the selection clock signal SCK is out of a preset reference frequency range or frequency shift has occurred to the selection clock signal SCK, the clock monitoring circuit 100 may determine that the frequency of the selection clock signal is defective.

In an embodiment, the clock enable signal generator 110 may generate an ultra-high frequency clock enable signal CEN_UHF, based on a clock enable control signal CEN_CTRL and a reference clock signal RCK.

The clock enable signal generator 110 may receive the clock enable control signal CEN_CTRL and the reference clock signal RCK from the electronic device. The clock enable control signal CEN_CTRL, which is a signal set according to the normal frequency range of the selection clock signal SCK, may include a high-frequency measurement interval, a low-frequency measurement interval, and an ultra-high frequency measurement interval. The reference clock signal RCK may be a clock signal different from the selection clock signal SCK used for monitoring of the selection clock signal SCK. The reference clock signal RCK may have a frequency different from that of the selection clock signal SCK.

The clock enable signal generator 110 may generate the ultra-high frequency clock enable signal CEN_UHF by dividing the reference clock signal RCK based on the ultra-high frequency measurement interval included in the clock enable control signal CEN_CTRL. The ultra-high frequency measurement interval may indicate an interval at which the number of times the reference clock signal RCK has a specific value (e.g., logic 1) is counted to determine whether the frequency of the selection clock signal is an ultra-high frequency. The clock enable signal generator 110 may generate the ultra-high frequency clock enable signal CEN_UHF such that the ultra-high frequency clock enable signal CEN_UHF has a specific value (e.g., logic 1) for a short time period at each ultra-high frequency measurement interval.

The clock enable signal generator 110 may output the ultra-high frequency clock enable signal CEN_UHF to the ultra-high frequency detector 140. The ultra-high frequency clock enable signal CEN_UHF may be used as a reset signal by the ultra-high frequency detector 140. Block referred to herein as "detector," "generator," "circuit," "register" and "determination circuit" may be implemented by hardware logic gates, transistors, hardware flip-flops, and custom hardware such an application specific integrated circuit (ASIC).

In an embodiment, the ultra-high frequency detector 140 may generate an ultra-high frequency determination signal UHFDET indicating whether the frequency of the selection clock signal SCK is an ultra-high frequency, based on the selection clock signal SCK, the ultra-high frequency clock enable signal CEN_UHF, and the reference clock signal RCK.

More particularly, the ultra-high frequency detector 140 may receive the selection clock signal SCK and the reference clock signal RCK from the electronic device. The ultra-high frequency detector 140 may receive the ultra-high frequency clock enable signal CEN_UHF from the clock enable signal generator 110.

The ultra-high frequency detector 140 may generate a RC clock signal by filtering the selection clock signal SCK. The ultra-high frequency detector 140 may generate an ultra-high frequency count value by counting the reference clock signal RCK based on the RC clock signal and the ultra-high frequency clock enable signal CEN_UHF. The ultra-high frequency detector 140 may generate the ultra-high frequency determination signal UHFDET based on the ultra-high frequency count value. Examples of a detailed configuration of the ultra-high frequency detector 140 will be described later with reference to FIGS. 2 and 3.

The ultra-high frequency detector 140 may output the ultra-high frequency determination signal UHFDET, which has been generated, to the electronic device. The ultra-high frequency determination signal UHFDET may be used to determine, by the electronic device, whether the frequency of the selection clock signal SCK is defective.

Figure 2:
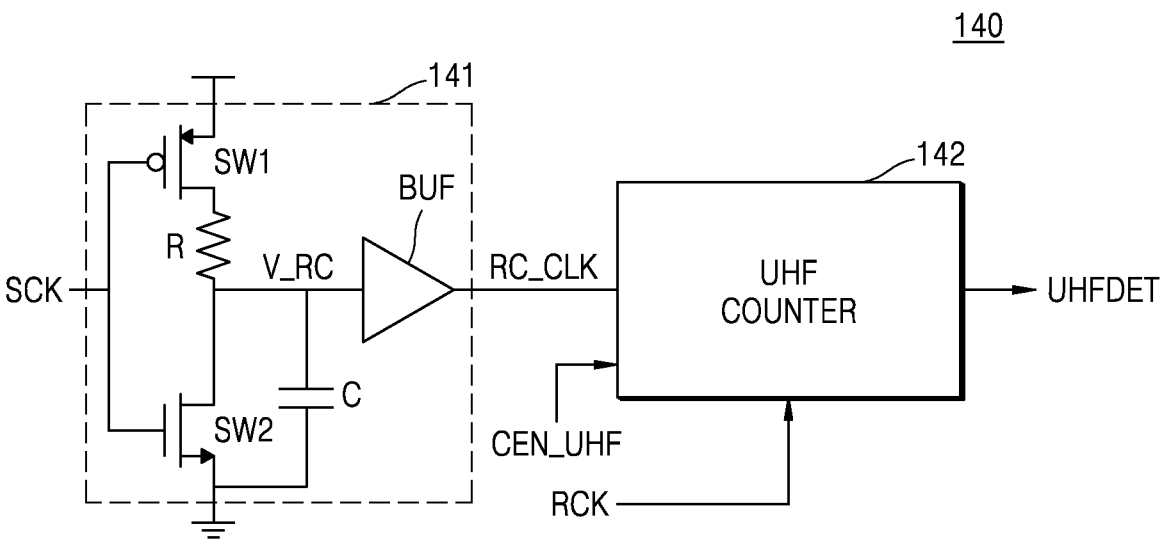
FIG. 2 is a diagram of an example of a detailed configuration of an ultra-high frequency detector of a clock monitoring circuit according to an embodiment.

FIG. 2 is a diagram of an example of a detailed configuration of the ultra-high frequency detector 140 of the clock monitoring circuit according to an embodiment.

Referring to FIG. 2, the ultra-high frequency detector according to an embodiment may include a resistor-capacitor (RC) filter 141 and an ultra-high frequency counter 142.

In an embodiment, the RC filter 141 may generate a RC clock signal RC_CLK by filtering the selection clock signal SCK.

More particularly, the RC filter 141 may include a first switching device SW1, a second switching device SW2, a resistor R, a capacitor C, and a buffer BUF.

The first switching device SW1 may receive the selection clock signal SCK through a gate terminal. A first terminal of the first switching device SW1 may be connected to a driving voltage terminal. A second terminal of the first switching device SW1 may be connected to a first terminal of the resistor R.

The second switching device SW2 may receive the selection clock signal SCK through a gate terminal. A first terminal of the second switching device SW2 may be connected to a second terminal of the resistor R. A second terminal of the second switching device SW2 may be connected to a ground voltage terminal.

In the resistor R, the first terminal may be connected to the second terminal of the first switching device SW1, and the second terminal may be connected to the first terminal of the second switching device SW2. That is, the resistor R may be connected between the first switching device SW1 and the second switching device SW2.

In the capacitor C, a first terminal may be connected to the second terminal of the resistor R, and a second terminal may be connected to the ground voltage terminal. That is, the capacitor C may be connected in parallel to the second switching device SW2.

In the aforementioned connection state, the capacitor C may be charged when a value of the selection clock signal SCK is logic 1, and may be discharged when the value of the selection clock signal SCK is logic 0. That is, the capacitor C may be charged and discharged according to the value of the selection clock signal SCK, and may apply a voltage V_RC through an input terminal of the buffer BUF.

Here, when the frequency of the selection clock signal SCK is an ultra-high frequency, the capacitor C may not be charged to be equal to or greater than a reference voltage to be described later. On the contrary, when the frequency of the selection clock signal SCK is not an ultra-high frequency, the capacitor C may be charged to be equal to or greater than the reference voltage.

The input terminal of the buffer BUF may be connected to the first terminal of the capacitor C. The buffer BUF may output the RC clock signal RC_CLK according to a result obtained by comparing the voltage V_RC input through the input terminal of the buffer BUF and the reference voltage that has been preset. For example, when the voltage V_RC being input is equal to or greater than the reference voltage, the buffer BUF may output the RC clock signal RC_CLK alternately having values of logic 1 and logic 0. On the contrary, when the voltage V_RC being input is less than the reference voltage, the buffer BUF may output the RC clock signal RC_CLK having a value of logic 0.

Here, the reference voltage may include a value equal to a voltage to which the capacitor C is charged in response to the selection clock signal SCK when the frequency of the selection clock signal SCK is a frequency determined as being at a boundary of the ultra-high frequency. Accordingly, when the voltage V_RC being input through the input terminal of the buffer BUF is equal to or greater than the reference voltage, the selection clock signal SCK may not be an ultra-high frequency signal. On the contrary, when the voltage V_RC input through the input terminal of the buffer BUF is less than the reference voltage, the selection clock signal SCK may be an ultra-high frequency signal.

The RC clock signal RC_CLK output by the buffer BUF may be input to the ultra-high frequency counter 142.

In an embodiment, the ultra-high frequency counter 142 may generate the ultra-high frequency determination signal UHFDET, based on the ultra-high frequency count value generated by counting the reference clock signal RCK based on the ultra-high frequency clock enable signal CEN_UHF and the RC clock signal RC_CLK.

More particularly, the ultra-high frequency counter 142 may receive the ultra-high frequency clock enable signal CEN_UHF from the clock enable signal generator 110, receive the RC clock signal RC_CLK from the RC filter 141, and receive the reference clock signal RCK from the electronic device.

The ultra-high frequency counter 142 may generate the ultra-high frequency count value by counting the reference clock signal RCK based on the ultra-high frequency clock enable signal CEN_UHF. For example, the ultra-high frequency counter 142 may generate the ultra-high frequency count value by counting the number of times the value of the reference clock signal RCK is logic 1 from a time point at which the ultra-high frequency clock enable signal CEN_UHF has a specific value (e.g., logic 1) to a time point at which the ultra-high frequency clock enable signal CEN_UHF has the specific value again.

Here, the ultra-high frequency counter 142 may reset the ultra-high frequency count value based on the RC clock signal RC_CLK. For example, when the value of the RC clock signal RC_CLK is logic 1, the ultra-high frequency counter 142 may reset the ultra-high frequency count value to be zero.

When the selection clock signal SCK is an ultra-high frequency signal, the voltage V_RC input to the buffer BUF may be less than the reference voltage, and therefore, the value of the RC clock signal RC_CLK may be maintained as logic 0. Accordingly, the ultra-high frequency count value may continuously increase without being reset in response to the RC clock signal RC_CLK.

On the other hand, when the selection clock signal SCK is not an ultra-high frequency signal, the voltage V_RC input to the buffer BUF may be equal to or greater than the reference value, and therefore, the RC clock signal RC_CLK may alternatively have values of logic 1 and logic 0. Accordingly, the ultra-high frequency count value may repeatedly increase and decrease while being periodically reset in response to the RC clock signal RC_CLK.

The ultra-high frequency counter 142 may generate the ultra-high frequency determination signal UHFDET based on a result obtained by comparing the ultra-high frequency count value and an ultra-high frequency reference value. The ultra-high frequency reference value may include a value that is reference for determining whether the selection clock signal SCK includes an ultra-high frequency signal.

When the ultra-high frequency count value is equal to or greater than the ultra-high frequency reference value, the ultra-high frequency counter 142 may set the value of the ultra-high frequency determination signal UHFDET (e.g., logic 1) to indicate that the selection clock signal SCK includes an ultra-high frequency signal. On the contrary, when the ultra-high frequency count value is less than the ultra-high frequency reference value, the ultra-high frequency counter 142 may set the value of the ultra-high frequency determination signal UHFDET (e.g., logic 0) to indicate that the selection clock signal SCK does not include an ultra-high frequency signal.

Figure 3:
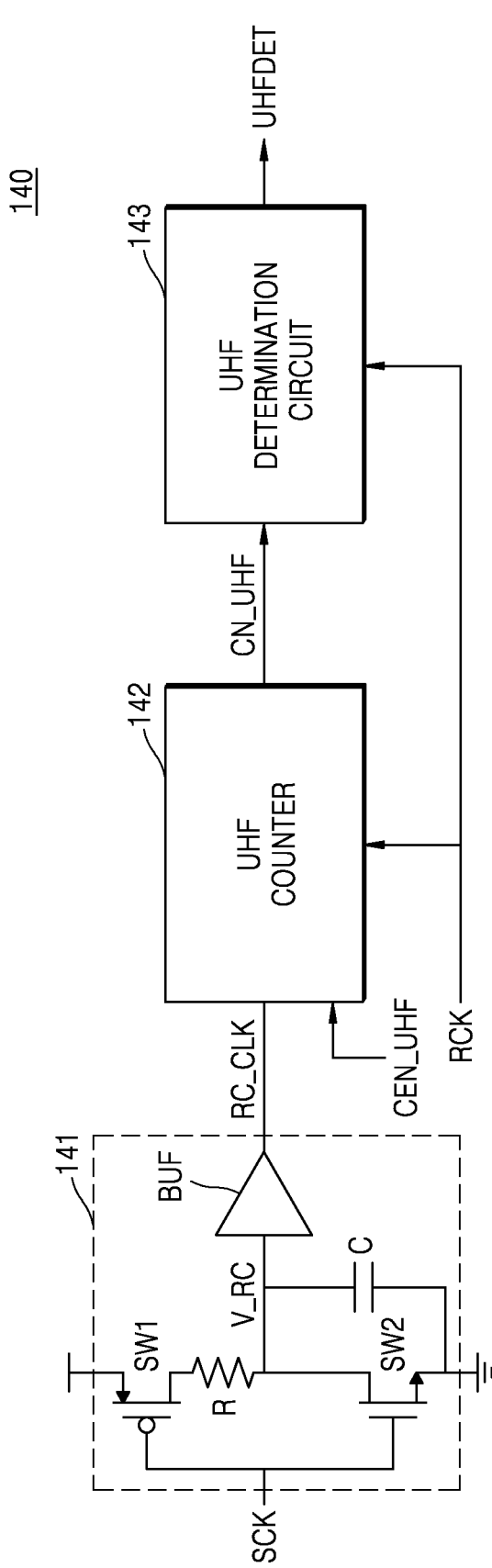
FIG. 3 is a diagram of another example of a detailed configuration of an ultra-high frequency detector of a clock monitoring circuit according to an embodiment.

FIG. 3 is a diagram of another example of a detailed configuration of the ultra-high frequency detector 140 of the clock monitoring circuit 100 according to an embodiment.

Referring to FIG. 3, the ultra-high frequency detector 140 of the clock monitoring circuit 100 according to an embodiment may include the RC filter 141, the ultra-high frequency counter 142, and an ultra-high frequency determination circuit 143. Here, as the embodiment shown in FIG. 3 is similar to the embodiment shown in FIG. 2, components having differences will be mainly described.

In an embodiment, the RC filter 141 shown in FIG. 3 may perform operations identical to the operations of the RC filter 141 shown in FIG. 2.

In an embodiment, the ultra-high frequency counter 142 may generate the ultra-high frequency count value CN_UHF by counting the reference clock signal RCK based on the ultra-high frequency clock enable signal CEN_UHF and the RC clock signal RC_CLK. A method in which the ultra-high frequency counter 142 shown in FIG. 3 generates the ultra-high frequency count value CN_UHF may be identical to the method by which the ultra-high frequency counter 142 shown in FIG. 2 generates the ultra-high frequency count value CN_UHF. Unlike the ultra-high frequency counter 142 shown in FIG. 2, the ultra-high frequency counter 142 shown in FIG. 3 may output the ultra-high frequency count value CN_UHF, which has been generated, to the ultra-high frequency determination circuit 143.

In an embodiment, the ultra-high frequency determination circuit 143 may generate the ultra-high frequency determination signal UHFDET based on the ultra-high frequency count value CN_UHF. The ultra-high frequency determination circuit 143 may generate the ultra-high frequency determination signal UHFDET based on a result obtained by comparing the ultra-high frequency count value CN_UHF and the ultra-high frequency reference value.

When the ultra-high frequency count value CN_UHF is equal to or greater than the ultra-high frequency reference value, the ultra-high frequency determination circuit 143 may set the value of the ultra-high frequency determination signal UHFDET (e.g., logic 1) to indicate that the selection clock signal SCK includes an ultra-high frequency signal. On the contrary, when the ultra-high frequency count value CN_UHF is less than the ultra-high frequency reference value, the ultra-high frequency determination circuit 143 may set the value of the ultra-high frequency determination signal UHFDET (e.g., logic 0) to indicate that the selection clock signal SCK does not include an ultra-high frequency signal.

Figure 4:
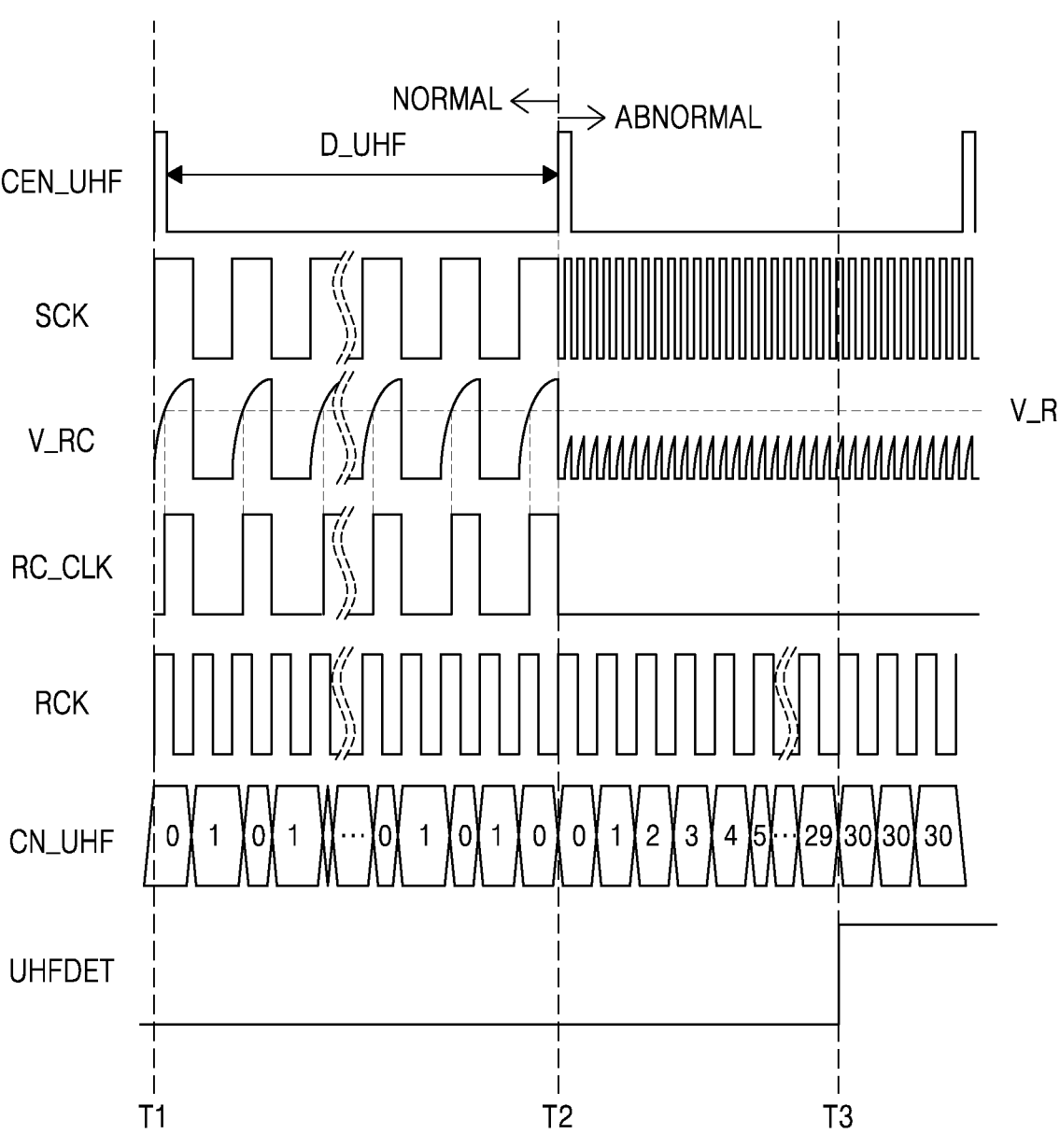
FIG. 4 is a timing chart of signals used by an ultra-high frequency detector of a clock monitoring circuit according to an embodiment.

FIG. 4 is a timing chart of signals used by the ultra-high frequency detector 142 of the clock monitoring circuit 100 according to an embodiment.

FIG. 4 is a timing chart illustrating change in time of the ultra-high frequency clock enable signal CEN_UHF, the selection clock signal SCK, the voltage V_RC input to the buffer BUF, the RC clock signal RC_CLK, the reference clock signal RCK, the ultra-high frequency count value CN_UHF, and the ultra-high frequency determination signal UHFDET when using the clock monitoring circuit 100 according to an embodiment.

The embodiment shown in FIG. 4 is an embodiment in which the frequency of the selection clock signal from to a first time point T1 to a second time point T2 is within the normal frequency range and the frequency of the selection clock signal SCK from the second time point T2 is an ultra-high frequency.

First, as the value of the ultra-high frequency clock enable signal CEN_UHF at the first time point T1 is logic 1 for a short time period, the ultra-high frequency count value CN_UHF may be reset to be 0, and the ultra-high frequency count value CN_UHF may be counted again. Here, the value of the ultra-high frequency count value CEN_UHF may be maintained as logic 0 for the ultra-high frequency measurement interval D_UHF.

As the frequency of the selection clock signal SCK from the first time point T1 to the second time point T2 is within the normal frequency range, the capacitor C of the RC filter 141 may be charged up to or beyond a reference voltage V_R. Accordingly, the RC clock signal RC_CLK output through the buffer BUF may alternately have values of logic 1 and logic 0.

Here, the ultra-high frequency count value CN_UHF counted by the ultra-high frequency counter 142 may be periodically reset as the value of the RC clock signal RC_CLK is logic 1, and thus may only have include 0 and 1. Accordingly, when the ultra-high frequency reference value is thirty, the ultra-high frequency count value CN_UHF is less than the ultra-high frequency reference value, and accordingly, the value of the ultra-high frequency determination signal UHFDET may include logic 0.

From the second time point T2, the frequency of the selection clock signal SCK is an ultra-high frequency, and accordingly, the capacitor C of the RC filter 141 may not be charged up to or beyond the reference voltage V_R. Accordingly, the RC clock signal RC_CLK output through the buffer BUF may have a value of logic 0.

Here, the ultra-high frequency count value CN_UHF counted by the ultra-high frequency counter 142 may continuously increase according to the value of the RC clock signal RC_CLK. Accordingly, at a third time point T3 at which the ultra-high frequency count value CN_UHF is thirty, the ultra-high frequency count value CN_UHF becomes equal to or greater than the ultra-high frequency reference value, and accordingly, the value of the ultra-high frequency determination signal UHFDET may be converted to logic 1.

The electronic device including the clock monitoring circuit 100 may confirm that the frequency of the selection clock signal SCK is an ultra-high frequency as the value of the ultra-high frequency determination signal UHFDET is logic 1. Accordingly, the electronic device may determine that a frequency defect has occurred to the selection clock signal SCK and perform a counter operation.

By using the clock monitoring circuit 100 according to an embodiment, it may be determined based on the ultra-high frequency clock enable signal CEN_UHF and the reference clock signal RCK whether the selection clock signal SCK is an ultra-high frequency signal, and by doing so, misoperation caused by the ultra-high frequency clock signal may be prevented.

Figure 5:
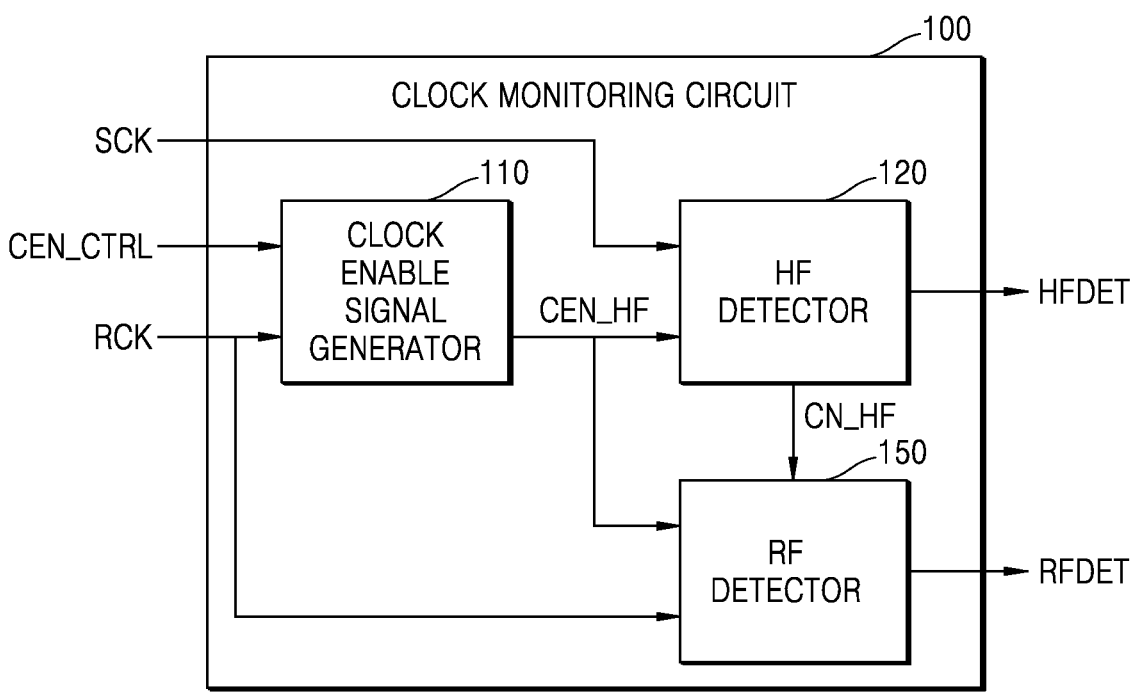
FIG. 5 is a block diagram of a clock monitoring circuit according to another embodiment.

FIG. 5 is a block diagram of the clock monitoring circuit 100 according to another embodiment.

Referring to FIG. 5, the clock monitoring circuit 100 according to another embodiment may include the clock enable signal generator 110, a high-frequency detector 120, and a random frequency detector 150.

In another embodiment, the clock enable signal generator 110 may generate a high-frequency clock enable signal CEN_HF based on the clock enable control signal CEN_CTRL and the reference clock signal RCK The clock enable signal generator 110 may receive the clock enable control signal CEN_CTRL and the reference clock signal RCK from the electronic device.

The clock enable signal generator 110 may generate the high-frequency clock enable signal CEN_HF by dividing the reference clock signal RCK based on a high-frequency measurement interval included in the clock enable control signal CEN_CTRL. The high-frequency measurement interval may indicate an interval at which the number of times having a specific value (e.g., logic 1) by the reference clock signal RCK is counted to determine whether the frequency of the selection clock signal SCK is a high frequency. The clock enable signal generator 110 may generate the high-frequency clock enable signal CEN_HF such that the high-frequency clock enable signal CEN_HF has a specific value (e.g., logic 1) for a short time period at each high-frequency measurement interval.

The clock enable signal generator 110 may output the high-frequency clock enable signal CEN_HF to the high-frequency detector 120 and the random frequency detector 150. Here, according to embodiments, the high-frequency clock enable signal CEN_HF may be output to the random frequency detector 150 through the high-frequency detector 120 without being directly output from the clock enable signal generator 110 to the random frequency detector 150.

The high-frequency clock enable signal CEN_HF may be used as a reset signal by the high frequency detector 120.

In another embodiment, the high-frequency detector 120 may generate a high-frequency count value CN_HF by counting the selection clock signal SCK based on the high-frequency clock enable signal CEN_HF.

More particularly, the high-frequency detector 120 may receive the selection clock signal SCK from the electronic device. The high-frequency detector 120 may receive the high-frequency clock enable signal CEN_HF from the clock enable signal generator 110.

The high-frequency detector 120 may generate the high-frequency count value CN_HF by counting the selection clock signal SCK based on the high-frequency clock enable signal CEN_HF. The high-frequency detector 120 may generate a high-frequency determination signal HFDET indicating whether the selection clock signal SCK is a high-frequency signal based on the high-frequency count value CN_HF. An example of a detailed configuration of the high-frequency detector 120 will be described later with reference to FIG. 6.

The high-frequency detector 120 may output the high-frequency determination signal HFDET, which has been generated, to the electronic device. The high-frequency determination signal HFDET may be used to determine, by the electronic device, whether the frequency of the selection clock signal SCK is defective.

In another embodiment, the random frequency detector 150 may generate a random frequency determination signal RFDET indicating whether frequency shift has occurred to the selection clock signal SCK, based on the high-frequency clock enable signal CEN_HF and the high-frequency count value CN_HF.

More particularly, the random frequency detector 150 may receive the reference clock signal RCK from the electronic device. The random frequency detector 150 may receive the high-frequency clock enable signal CEN_HF from the clock enable signal generator 110. The random frequency detector 150 may receive the high-frequency count values CN_HF from the high-frequency detector 120.

The random frequency detector 150 may shift and store the high-frequency count values CN_HF based on the high-frequency clock enable signal CEN_HF. The random frequency detector 150 may generate the random frequency determination signal RFDET by comparing the high-frequency count values CN_HF that have been stored. An example of a detailed configuration of the random frequency detector 150 will be described later with reference to FIG. 7.

The random frequency detector 150 may output the random frequency determination signal RFDET, which has been generated, to the electronic device. The random frequency determination signal RFDET may be used to determine, by the electronic device, whether the frequency of the selection clock signal SCK is defective.

Figure 6:
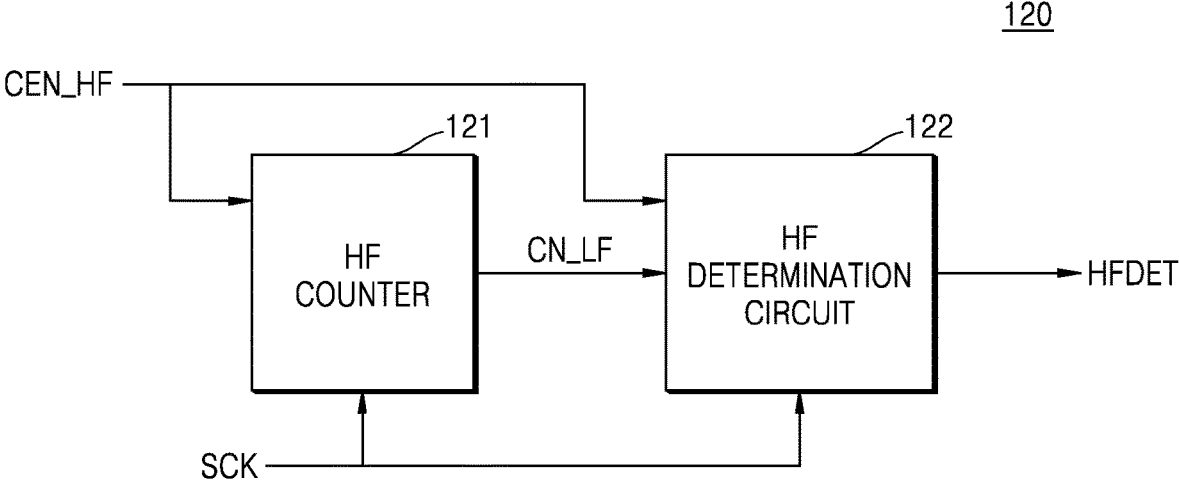
FIG. 6 is a diagram of a detailed configuration of a high-frequency detector of a clock monitoring circuit according to an embodiment.

FIG. 6 is a diagram of a detailed configuration of the high-frequency detector 120 of the clock monitoring circuit 100 according to another embodiment.

Referring to FIG. 6, the high-frequency detector 120 according to another embodiment may include a high-frequency counter 121 and a high-frequency determination circuit 122.

The high-frequency counter 121 may receive the high-frequency clock enable signal CEN_HF from the clock enable signal generator 110, and may receive the selection clock signal SCK from the electronic device.

In another embodiment, the high-frequency counter 121 may generate the high-frequency count value CN_HF by counting the selection clock signal SCK based on the high-frequency clock enable signal CEN_HF. For example, the high-frequency counter 121 may generate the high-frequency count value CN_HF by counting the number of times the value of the selection clock signal SCK is logic 1 from a time point at which the high-frequency clock enable signal CEN_HF has a specific value (e.g., logic 1) for a short time period to a time point at which the high-frequency clock enable signal CEN_HF has the specific value again. As described above, the high-frequency counter 121 may count the number of clocks of the selection clock signal SCK during the high-frequency measurement interval. The high-frequency counter 121 may output the high-frequency count value CN_HF to the high-frequency determination circuit 122 and the random frequency detector 150.

In another embodiment, the high-frequency determination circuit 122 may generate the high-frequency determination signal HFDET based on the high-frequency count value CN_HF.

The high-frequency determination circuit 122 may receive the high-frequency count value CN_HF from the high-frequency counter 121.

The high-frequency determination circuit 122 may generate the high-frequency determination signal HFDET based on a resulted obtained by comparing the high-frequency count value CN_HF and a high-frequency reference value. The high-frequency reference value may include a value that is a reference for determining whether the selection clock signal SCK is a high-frequency signal.

When the high-frequency count value CN_HF is equal to or greater than the high-frequency reference value, the high-frequency determination circuit 122 may set a value of the high-frequency determination signal HFDET (e.g., logic 1) to indicate that the selection clock signal SCK is a high-frequency signal. On the other hand, when the high-frequency count value CN_HF is less than the high-frequency reference value, the high-frequency determination circuit 122 may set the value of the high-frequency determination signal HFDET (e.g., logic 0) to indicate that the selection clock signal SCK is not a high-frequency signal.

Figure 7:
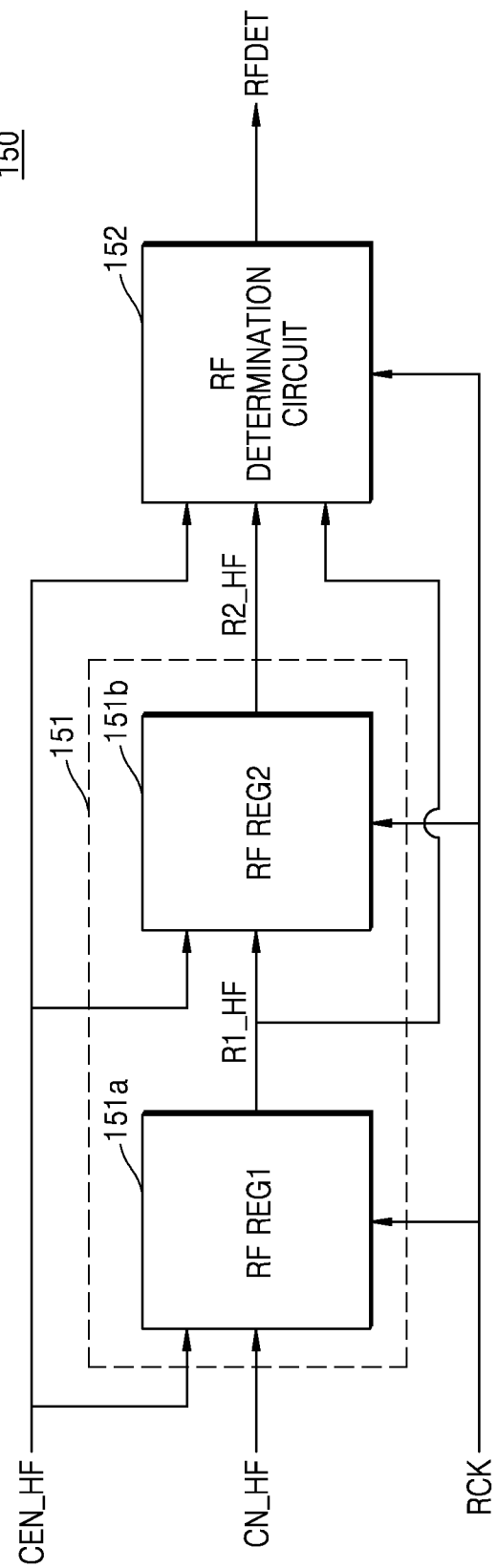
FIG. 7 is a diagram of a detailed configuration of a random frequency detector of a clock monitoring circuit according to another embodiment.

FIG. 7 is a diagram of a detailed configuration of the random frequency detector 150 of the clock monitoring circuit 100 according to another embodiment.

Referring to FIG. 7, the random frequency detector 150 may include a register circuit 151 and a random frequency determination circuit 152. The register circuit 151 and the random frequency determination circuit 152 may operate using the reference clock signal RCK as a clock signal.

In another embodiment, the register circuit 151 may shift and store the high-frequency count value CN_HF based on the high-frequency clock enable signal CEN_HF.

More particularly, the register circuit 151 may include a first register 151*a* and a second register 151*b*.

The first register 151a may receive the high-frequency clock enable signal CEN_HF and the high-frequency count value CN_HF.

The first register 151a may store the high-frequency count value CN_HF received from the high-frequency detector 120 as a first register value R1_HF, based on the high-frequency clock enable signal CEN_HF. For example, when the value of the high-frequency clock enable signal CEN_HF is logic 1, the first register 151a may receive the high-frequency count value CN_HF from the high-frequency detector 120, and may store the high-frequency count value CN_HF, which has been received, as the first register value R1_HF.

The first register 151a may output the first register value R1_HF, which has been stored, to the second register 151b and the random frequency determination circuit 152.

The second register 151b may receive the high-frequency clock enable signal CEN_HF and the first register value R1_HF.

The second register 151b may store the high-frequency count value CN_HF received from the first register 151a as a second register value R2_HF, based on the high-frequency clock enable signal CEN_HF. For example, when the value of the high-frequency clock enable signal CEN_HF is logic 1, the second register 151b may receive the first register value R1_HF from the first register 151a, and may store the first register value R1_HF, which has been received, as the second register value R2_HF. The second register 151b may output the second register value R2_HF, which has been stored, to the random frequency determination circuit 152.

The random frequency determination circuit 152 may generate the random frequency determination signal RFDET by comparing the high-frequency count values CN_HF stored in the resistor circuit 151.

More particularly, the random frequency determination circuit 152 may receive the high-frequency clock enable signal CEN_HF, the first register value R1_HF, and the second register value R2_HF.

The random frequency determination circuit 152 may generate the random frequency determination signal RFDET based on a result obtained by comparing the first register value R1_HF and the second register value R2_HF.

When the first register value R1_HF and the second register value R2_HF are equal to each other, the random frequency determination circuit 152 may set a value of the random frequency determination signal RFDET (e.g., logic 0) to indicate that frequency shift has not occurred to the selection clock signal SCK. On the contrary, when the first register value R1_HF and the second register value R2_HF are not equal to each other, the random frequency determination circuit 152 may set the value of the random frequency determination signal RFDET (e.g., logic 1) to indicate that frequency shift has occurred to the selection clock signal SCK.

Control of RF REG1 151a and RF REG2 151b, in some embodiments, is performed by RF Determination Circuit 152. RF Determination Circuit 152 may include hardware logic gates implementing a state machine, a custom hardware circuit such as an ASIC or a hardware processor such as a CPU executing instructions from a memory (not shown). Alternatively, RF REG1 151a, RF REG2 151b, and the RF Determination Circuit 152 may be controlled by a custom hardware circuit such as an ASIC or controlled by a CPU (such as 200 in FIG. 12).

Figure 8:
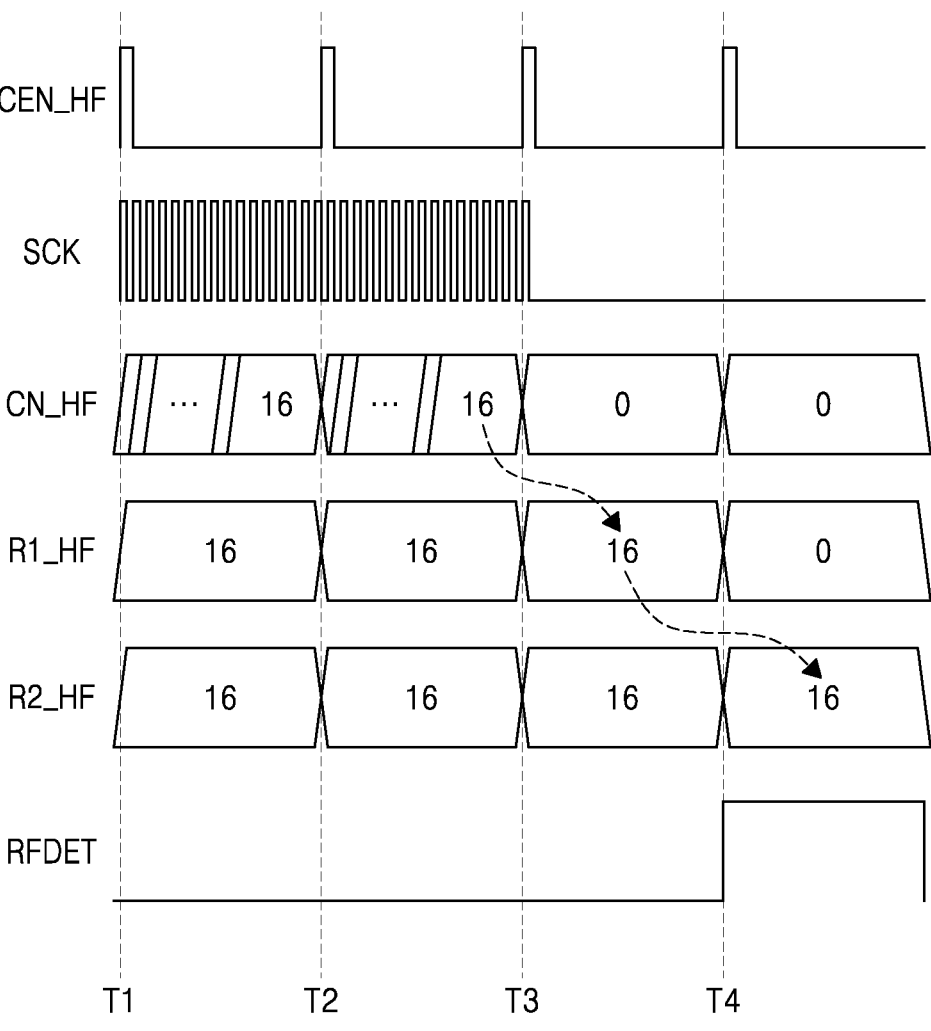
FIG. 8 is a timing chart of signals used by a random frequency detector of a clock monitoring circuit according to another embodiment.

FIG. 8 is a timing chart of signals used by the random frequency detector 150 of the clock monitoring circuit 100 according to another embodiment.

FIG. 8 is a timing chart indicating change in time of the high-frequency clock enable signal CEN_HF, the selection clock signal SCK, the high-frequency count value CN_HF, the first register value R1_HF, and the second register value R2_HF, and the random frequency determination signal RFDET when using the clock monitoring circuit 100 according to another embodiment.

The embodiment shown in FIG. 8 is an embodiment in which frequency shift occurs to the selection clock signal SCK at the third time point T3.

First, there is no change in the frequency of the selection clock signal SCK from the first time point T1 to the second time point T2. Accordingly, the high-frequency count value CN_HF output from the high-frequency counter 121 at the second time point T2 may be sixteen, and this may be equal to sixteen, i.e., the first register value R1_HF that has been previously output from the high-frequency counter 121 and stored in the first register 151a.

At the second time point T2, the high-frequency count value CN_HF output from the high-frequency counter 121 may be stored as the first register value R1_HF in the first register 151a, and the first register value R1_HF output from the first register 151a may be stored as the second register value R2_HF in the second register 151b. Here, as the first register value R1_HF and the second register value R2_HF are equal to each other, the value of the random frequency determination signal RFDET may be set as logic 0.

Next, there is no change in the frequency of the selection clock signal SCK from the second time point T2 to the third time point T3. Accordingly, the high-frequency count value CN_HF output from the high-frequency counter 121 at the third time point T3 may be sixteen, and this may be equal to sixteen, i.e., the first register value R1_HF that has been output from the high-frequency counter 121 at the second time point T2 and stored in the first register 151a.

At the third time point T3, the high-frequency count value CN_HF output from the high-frequency counter 121 may be stored as the first register value R1_HF in the first register 151a, and the first register value R1_HF output from the first register 151a may be stored as the second register value R2_HF in the second register 151b. Here, as the first register value R1_HF and the second register value R2_HF are equal to each other, the value of the random frequency determination signal RFDET may be set as logic 0.

Next, from the third time point T3 to a fourth time point T4, the frequency of the selection clock signal SCK changes to zero at the third time point T3. Accordingly, the high-frequency count value CN_HF may be maintained as zero without an increase, from the third time point T3 to the fourth time point T4. Accordingly, the high-frequency count value CN_HF output from the high-frequency counter 121 at the fourth time point T4 may be zero, and this may be different from sixteen, i.e., the first register value R1_HF output from the high-frequency counter 121 at the third time point T3 and stored in the first register 151a.

At the fourth time point T4, the high-frequency count value CN_HF output from the high-frequency counter 121 may be stored as the first register value R1_HF in the first register 151a, and the first register value R1_HF output from the first register 151a may be stored as the second register value R2_HF in the second register 151b. Here, as the first register value R1_HF is zero and the second register value R2_HF is maintained as sixteen, the first register value R1_HF and the second register value R2_HF are different from each other. Accordingly, the value of the random frequency determination signal RFDET set by the random frequency determination circuit 152 may be set as logic 1.

As the value of the random frequency determination signal RFDET is logic 1, the electronic device including the clock monitoring circuit 100 may check that frequency shift has occurred to the selection clock signal SCK. Accordingly, the electronic device may determine that a frequency defect has occurred to the selection clock signal SCK and perform a counter operation.

By using the clock monitoring circuit 100 according to an embodiment, it may be determined based on the high-frequency clock enable signal CEN_HF and the high-frequency count value CN_HF whether frequency shift occurred to the selection clock signal SCK, and by doing so, misoperation caused by the clock signal in which frequency shift has occurred may be prevented.

Figure 9:
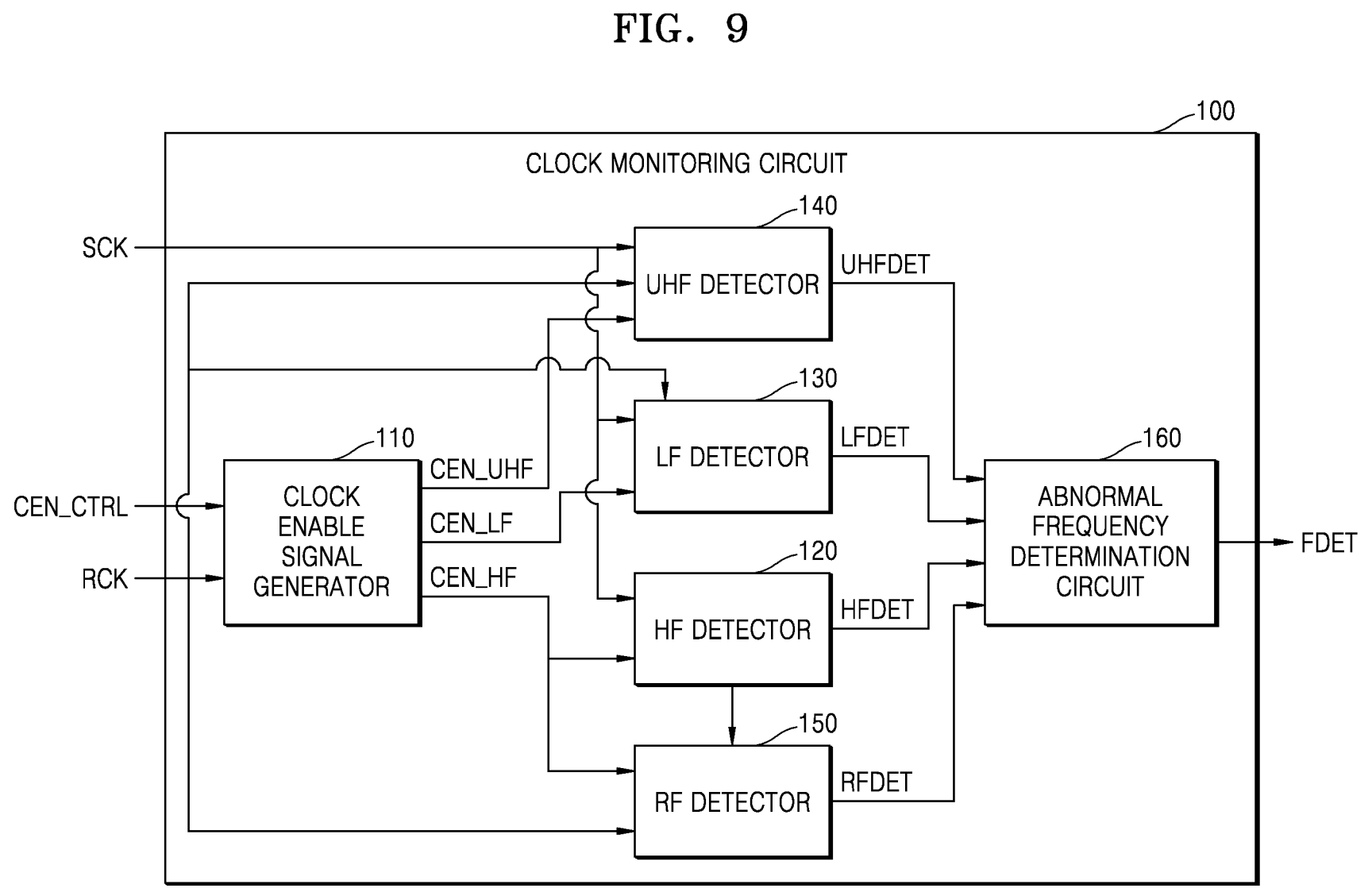

FIG. 9 is a block diagram of the clock monitoring circuit 100 according to another embodiment.

Referring to FIG. 9, the clock monitoring circuit 100 according to another embodiment may include the clock enable signal generator 110, the high-frequency detector 120, a low-frequency detector 130, the ultra-high frequency detector 140, and the random frequency detector 150. In addition, the clock monitoring circuit 100 according to another embodiment may further include a abnormal frequency determination circuit 160.

The clock monitoring circuit 100 may be included in an electronic device. The clock monitoring circuit 100 may monitor a selection clock signal SCK that is any one signal selected from among clock signals used by the electronic device. The clock monitoring circuit 100 may monitor the selection clock signal SCK to determine whether a frequency of the selection clock signal SCK is defective, and may generate and output a signal according to a result of the determination.

In another embodiment, the clock enable signal generator 110 may generate the high-frequency clock enable signal CEN_HF, a low-frequency clock enable signal CEN_LF, and the ultra-high frequency clock enable signal CEN_UHF, based on the clock enable control signal CEN_CTRL and the reference clock signal RCK.

The clock enable signal generator 110 may receive the clock enable control signal CEN_CTRL and the reference clock signal RCK from the electronic device.

A method of generating the ultra-high frequency clock enable signal CEN_UHF by the clock enable signal generator 110 may be identical to the method described above with reference to FIG. 1, and a method of generating the high-frequency clock enable signal CEN_HF by the clock enable signal generator 110 may be identical to the method described above with reference to FIG. 5.

The clock enable signal generator 110 may generate the low-frequency clock enable signal CEN_LF by dividing the reference clock signal RCK based on a low-frequency measurement interval included in the clock enable control signal CEN_CTRL. The low-frequency measurement interval may indicate an interval at which the number of times having a specific value (e.g., logic 1) by the selection clock signal SCK is counted to determine whether the frequency of the selection clock signal SCK is a low frequency. The clock enable signal generator 110 may generate the low-frequency clock enable signal CEN_LF such that the low-frequency clock enable signal CEN_LF has a specific value (e.g., logic 1) for a short time period at each low-frequency measurement interval.

Here, the high-frequency measurement interval may be smaller than the low-frequency measurement interval. This is because a low-frequency clock signal needs to be counted for a longer time period for accurate measurement, compared with a high-frequency clock signal.

The clock enable signal generator 110 may output the low-frequency clock enable signal CEN_LF to the low-frequency detector 130. The low-frequency clock enable signal CEN_LF may be used as a reset signal by the low-frequency detector 130.

In another embodiment, a detailed configuration and operations of the high-frequency detector 120 may be identical to the configuration and operations described above with reference to FIGS. 5 and 6.

In another embodiment, the low-frequency detector 130 may generate a low-frequency count value CN_LF by counting the selection clock signal SCK based on the low-frequency clock enable signal CEN_LF.

More particularly, the low-frequency detector 130 may receive the selection clock signal SCK and the reference clock signal RCK from the electronic device. The low-frequency detector 130 may receive the low-frequency clock enable signal CEN_LF from the clock enable signal generator 110.

The low-frequency detector 130 may generate the low-frequency count value CN_LF by counting the selection clock signal SCK based on the low-frequency clock enable signal CEN_LF. The low-frequency detector 130 may generate a low-frequency determination signal LFDET indicating whether the selection clock signal SCK is a low-frequency signal, based on the low-frequency count value CN_LF. An example of a detailed configuration of the low-frequency detector 130 will be described later with reference to FIG. 10.

The low-frequency detector 130 may output the low-frequency determination signal LFDET, which has been generated, to the electronic device. The low-frequency determination signal LFDET may be used to determine, by the electronic device, whether the frequency of the selection clock signal SCK is defective.

In another embodiment, a detailed configuration and operations of the ultra-high frequency detector 140 may be identical to the configuration and operations described above with reference to FIGS. 1, 2, and 3.

In another embodiment, a detailed configuration and operations of the random frequency detector 150 may be identical to the detailed configuration and operations described above with reference to FIGS. 5 and 7.

In another embodiment, the abnormal frequency determination circuit 160 may generate an abnormal frequency determination signal indicating whether the selection clock signal SCK is defective, based on the high-frequency determination signal HFDET, the low-frequency determination signal LFDET, the ultra-high frequency determination signal UHFDET, and the random frequency determination signal RFDET.

The abnormal frequency determination circuit 160 may receive the high-frequency determination signal HFDET from the high-frequency detector 120. The abnormal frequency determination circuit 160 may receive a low-frequency determination signal LFDET from the low-frequency detector 130. The abnormal frequency determination circuit 160 may receive the ultra-high frequency determination signal UHFDET from the ultra-high frequency detector 140. The abnormal frequency determination circuit 160 may receive the random frequency determination signal RFDET from the random frequency detector 150.

When at least one of the high-frequency determination signal HFDET, the low-frequency determination signal LFDET, the ultra-high frequency determination signal UHF- DET, and the random frequency determination signal RFDET indicates that the frequency of the selection clock signal SCK is defective, the abnormal frequency determination circuit 160 may generate the abnormal frequency determination signal FDET to indicate that the selection clock signal SCK is defective.

For example, when the high-frequency determination signal HFDET indicates that the selection clock signal SCK is a high-frequency signal, the low-frequency determination signal LFDET indicates that the selection clock signal SCK is a low-frequency signal, the ultra-high frequency determination signal UHFDET indicates that the selection clock signal SCK is an ultra-high frequency signal, or the random frequency determination signal RFDET indicates that the selection clock signal SCK is a random frequency signal, the abnormal frequency determination circuit 160 may set a value of the abnormal frequency determination signal FDET to indicate that the selection clock signal SCK is defective.

The abnormal frequency determination circuit 160 may be configured by including at least one of logic gates, such as an OR gate, an AND gate, and a NOT gate.

When the value of the high-frequency determination signal HFDET indicating that the selection clock signal SCK is a high-frequency signal is logic 1, the value of the low-frequency determination signal LFDET indicating that the selection clock signal SCK is a low-frequency signal is logic 1, the value of the ultra-high frequency determination signal UHFDET indicating that the selection clock signal SCK is an ultra-high frequency signal is logic 1, the value of a random frequency determination signal RFDET indicating that the selection clock signal SCK is a random frequency signal is logic 1, the abnormal frequency determination circuit 160 may include an OR gate configured to receive the high-frequency determination signal HFDET, the low-frequency determination signal LFDET, the ultra-high frequency determination signal UHFDET, and the random frequency determination signal RFDET, perform an OR operation thereon, and output a result of the OR operation.

Figure 10:
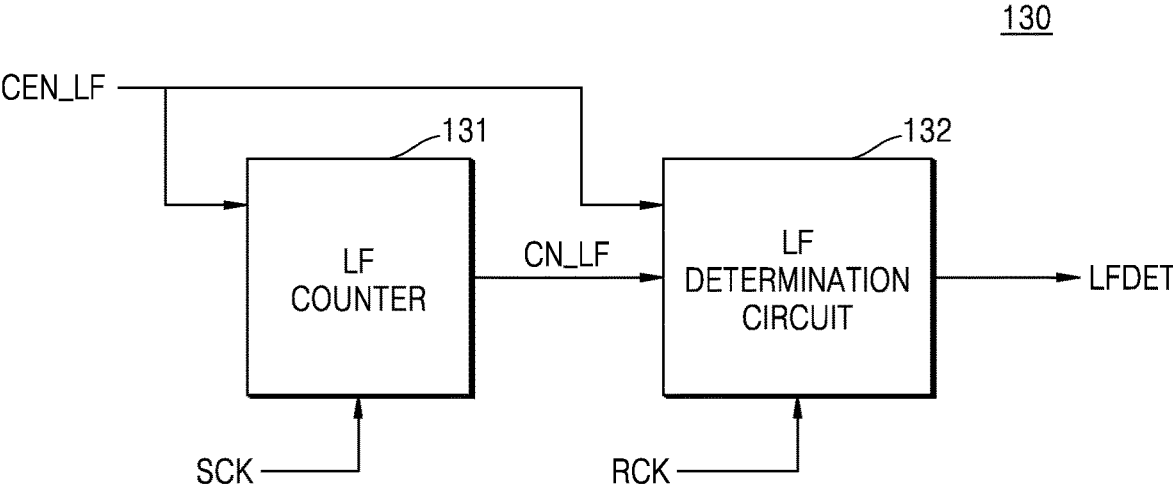
FIG. 10 is a diagram of a detailed configuration of a low-frequency detector of a clock monitoring circuit according to another embodiment.

FIG. 10 is a diagram of a detailed of the low-frequency detector 130 of the clock monitoring circuit 100 according to another embodiment.

Referring to FIG. 10, the low-frequency detector 130 according to another embodiment may include a low-frequency counter 131 and a low-frequency determination circuit 132.

The low-frequency counter 131 may receive the low-frequency clock enable signal CEN_LF from the clock enable signal generator 110, and may receive the selection clock signal SCK and the reference clock signal RCK from the electronic device.

In another embodiment, the low-frequency counter 131 may generate the low-frequency count value CN_LF by counting the selection clock signal SCK based on the low-frequency clock enable signal CEN_LF. For example, the low-frequency counter 131 may generate the low-frequency count value CN_LF by counting the number of times the value of the selection clock signal SCK is logic 1 from a time point at which the low-frequency clock enable signal CEN_LF has a specific value (e.g., logic 1) for a short time period to a time point at which the low-frequency clock enable signal CEN_LF has the specific value again. As described above, the low-frequency counter 131 may count the number of clocks of the selection clock signal SCK during the low-frequency measurement interval. The low-frequency counter 131 may output the low-frequency count value CN_LF to the low-frequency determination circuit 132.

In another embodiment, the low-frequency determination circuit 132 may generate the low-frequency determination signal LFDET based on the low-frequency count value CN_LF.

The low-frequency determination circuit 132 may receive the low-frequency count value CN_LF from the low-frequency counter 131.

The low-frequency determination circuit 132 may generate the low-frequency determination signal LFDET based on a result obtained by comparing the low-frequency count value CN_LF and a low-frequency reference value. The low-frequency reference value may include a value that is a reference for determining whether the selection clock signal SCK is a low-frequency signal.

When the low-frequency count value CN_LF is less than the low-frequency reference value, the low-frequency determination circuit 132 may set the value of the low-frequency determination signal LFDET (e.g., logic 1) to indicate that the selection clock signal SCK is a low-frequency circuit. On the other hand, when the low-frequency count value CN_LF is equal to or greater than the low-frequency reference value, the low-frequency determination circuit 132 may set the value of the low-frequency determination signal LFDET (e.g., logic 0) to indicate that the selection clock signal SCK is not a low-frequency signal.

Figure 11:
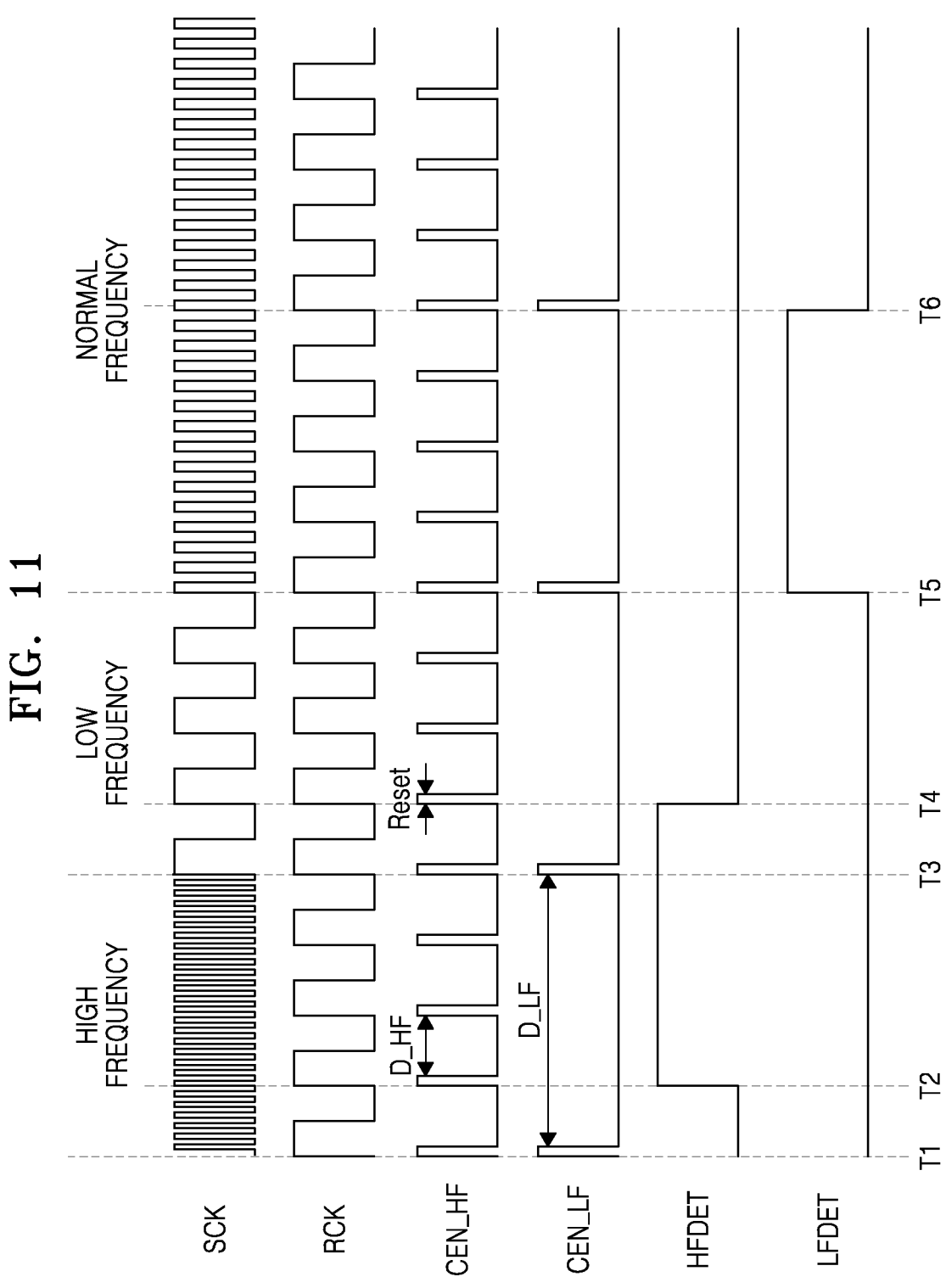
FIG. 11 is a timing chart of signals used by a high-frequency detector and a low-frequency detector of a clock monitoring circuit according to another embodiment.

FIG. 11 is a timing chart of signals used by the high-frequency detector and the low-frequency detector of the clock monitoring circuit 100 according to another embodiment.

FIG. 11 illustrates a timing chart indicating changes in time of the selection clock signal SCK, the reference clock signal RCK, the high-frequency clock enable signal CEN_HF, the low-frequency clock enable signal CEN_LF, the high-frequency determination signal HFDET, and the low-frequency determination signal LFDET when using the clock monitoring circuit 100 according to another embodiment.

The embodiment shown in FIG. 11 is an embodiment in which the selection clock signal SCK is a high-frequency signal from the first time point T1 to the third time point T3, the selection clock signal SCK is a low-frequency signal from the third time point T3 to a fifth time point T5, and the frequency of the selection clock signal SCK is within the normal frequency range after the fifth time point T5.

First, as values of the high-frequency clock enable signal CEN_HF and the low-frequency clock enable signal CEN_LF are logic 1 for a short time period at the first time point T1, the high-frequency count value CN_HF and the low-frequency count value CN_LF may be reset to be zero and then counted. Here, the value of the high-frequency clock enable signal CEN_HF may be maintained as logic 0 for the high-frequency measurement interval D_HF, and the value of the low-frequency clock enable signal CEN_LF may be maintained as logic 0 for the low-frequency measurement interval D_LF.

It may be found, as the value of the high-frequency clock enable signal CEN_HF is logic 1 and the high-frequency count value CN_HF is equal to or greater than the high-frequency reference value at the second time point T2, the value of the high-frequency determination signal HFDET is changed to be logic 1. Here, the value of the low-frequency determination signal LFDET may be maintained as logic 0.

It may be found that the selection clock signal SCK is changed from a high-frequency signal to a low-frequency signal at the third time point T3.

Accordingly, it may be found that at the fourth time point T4, as the value of the high-frequency clock enable signal CEN_HF is logic 1 and the high-frequency count value CN_HF is less than the high-frequency reference value, the value of the high-frequency determination signal HFDET is changed to be logic 0.

It also may be found that at the fifth time point T5, as the value of the low-frequency clock enable signal CEN_LF is logic 1 and the low-frequency count value CN_LF is less than the low-frequency reference value, the value of the low-frequency determination signal LFDET is changed to be logic 1. Here, the value of the high-frequency determination signal HFDET may be maintained as logic 0.

In addition, it may also be found that the selection clock signal SCK is changed from a low-frequency signal to a signal within the normal frequency range at the fifth time point T5.

Accordingly, it may be found that at a sixth time point T6, as the value of the low-frequency clock enable signal CEN_LF is logic 1 and the low-frequency count value CN_LF is equal to or greater than the low-frequency reference value, the value of the low-frequency determination signal LFDET is changed to be logic 0.

As described above, by using the clock monitoring circuit 100 according to the embodiments, it may be determined whether the selection clock signal SCK is a high-frequency signal, a low-frequency signal, or an ultra-high frequency signal, and whether there has been frequency shift in the selection clock signal SCK, and by doing so, misoperation in response to a clock signal including an abnormal frequency may be prevented.

Figure 12:
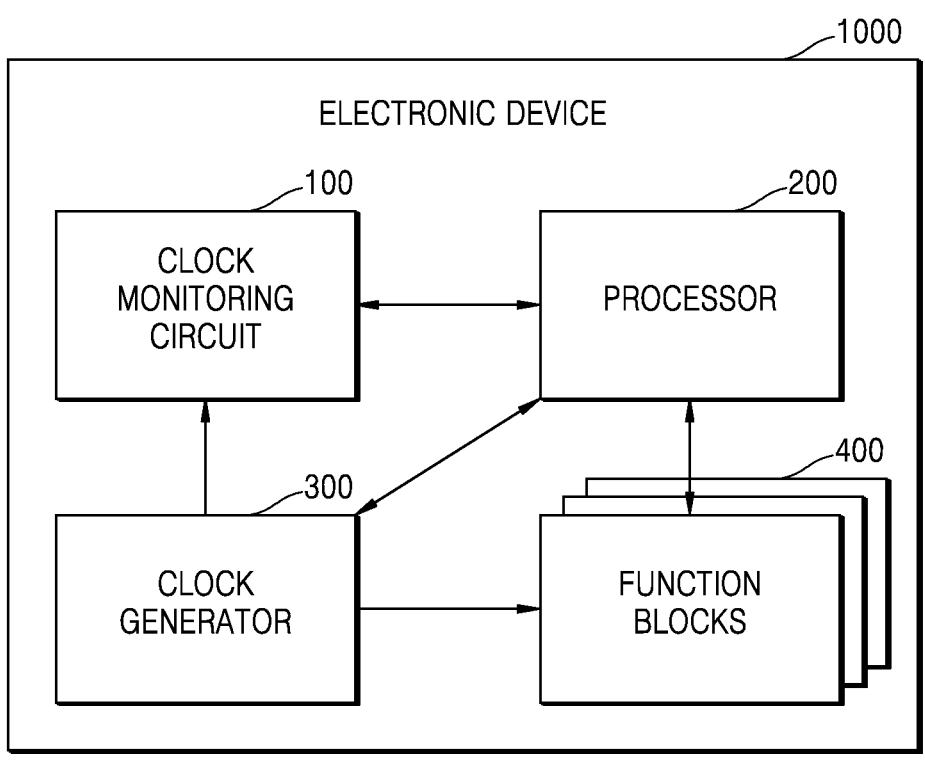
FIG. 12 is a block diagram of an electronic device according to an embodiment.

FIG. 12 is a block diagram of an electronic device 1000 according to an embodiment.

Referring to FIGS. 12, an electronic device 1000 according to an embodiment may include the clock monitoring circuit 100, a processor 200, a clock generator 300, and function blocks 400.

Any one of the clock monitoring circuits 100 described above with reference to FIGS. 1 to 11 may be used as the clock monitoring circuit 100.

The processor 200 may control overall operations of the electronic device 1000, and an embodiment, the processor 200 may include a central processing unit (CPU).

The clock generator 300 may generate various kinds of clock signals, and may include at least one of a phase-locked loop (PLL), a delay-locked loop (DLL), a clock multiplier, and a clock distributor. The clock monitoring circuit 100, the processor 200, and the function blocks 400 may operate in response to clock signals generated by the clock generator 300.

The function blocks 400 may perform their own functions, and operations of the function blocks 400 may be controlled by the processor 200. In an embodiment, the function blocks 400 may include a memory controller, a display controller, a graphic processing unit (GPU), an image signal processor, a multi format codec block, and the like.

In an embodiment, the processor 200 may transmit one of clocks generated by the clock generator to the clock monitoring circuit 100 as the selection clock signal SCK. In addition, the processor 200 may transmit the clock enable control signal CEN_CTRL corresponding to the selection clock signal SCK to the clock monitoring circuit 100. The clock generator 300 may transmit the reference clock signal RCK to the clock monitoring circuit 100. Accordingly, the clock monitoring circuit 100 may determine whether the frequency of the selection clock signal SCK is defective, based on the clock enable control signal CEN_CTRL and the reference clock signal RCK, and may transmit a result of the determination to the processor 200. The processor 200 may determine whether the selection clock signal SCK is defective based on the result of the determination received from the clock monitoring circuit 100. When it is determined that the selection clock signal SCK is defective, the processor 200 may perform counter operations such as adjusting the operations of the clock generator 300.

While certain embodiments have been shown and described, it will be understood that various changes in form and details may be made therein without departing from the spirit and scope of the following claims.

What is claimed is:

1. A clock monitoring circuit configured to monitor a selection clock signal, the clock monitoring circuit comprising:

a clock enable signal generator configured to generate a high-frequency clock enable signal, a low-frequency clock enable signal, and an ultra-high frequency clock enable signal based on a clock enable control signal and a reference clock signal;

a high-frequency detector configured to generate a high-frequency count value by counting the selection clock signal based on the high-frequency clock enable signal and generate a high-frequency determination signal, which indicates whether the selection clock signal is a high-frequency signal, based on the high-frequency count value;

a low-frequency detector configured to generate a low-frequency count value by counting the selection clock signal based on the low-frequency clock enable signal and generate a low-frequency determination signal based on the low-frequency count value, the low-frequency determination signal indicating whether the selection clock signal is a low-frequency signal;

an ultra-high frequency detector configured to generate an ultra-high frequency determination signal based on the selection clock signal, the ultra-high frequency clock enable signal, and the reference clock signal, the ultra-high frequency determination signal indicating whether the selection clock signal is an ultra-high frequency signal; and a random frequency detector configured to generate a random frequency determination signal based on the high-frequency clock enable signal and the high-frequency count value, the random frequency determination signal indicating whether frequency shift has occurred to the selection clock signal.

2. The clock monitoring circuit of claim 1, wherein the clock enable signal generator is configured to generate the high-frequency clock enable signal, the low-frequency clock enable signal, and the ultra-high frequency clock enable signal by dividing the reference clock signal based on a high-frequency measurement interval, a low-frequency measurement interval, and an ultra-high frequency measurement interval included in the clock enable control signal.

3. The clock monitoring circuit of claim 2, wherein the high-frequency measurement interval is shorter than the low-frequency measurement interval.

4. The clock monitoring circuit of claim 1, wherein the ultra-high frequency detector comprises:

a resistor-capacitor (RC) filter configured to generate an RC clock signal by filtering the selection clock signal; and an ultra-high frequency counter configured to generate the ultra-high frequency determination signal based on an ultra-high frequency count value, the ultra-high frequency count value being generated by counting the reference clock signal based on the ultra-high frequency clock enable signal and the RC clock signal.

5. The clock monitoring circuit of claim 1, wherein the random frequency detector comprises:

a register circuit configured to shift and store the high-frequency count value based on the high-frequency clock enable signal; and a random frequency determination circuit configured to generate the random frequency determination signal by comparing a first high-frequency count value stored in the register circuit and a second high-frequency count value stored in the register circuit.

6. The clock monitoring circuit of claim 1, further comprising an abnormal frequency determination circuit configured to generate an abnormal frequency determination signal based on the high-frequency determination signal, the low-frequency determination signal, the ultra-high frequency determination signal, and the random frequency determination signal, the abnormal frequency determination signal indicating whether the selection clock signal is defective.

7. The clock monitoring circuit of claim 6, wherein the abnormal frequency determination circuit is configured to generate the abnormal frequency determination signal to indicate that the selection clock signal is defective, based on at least one of the high-frequency determination signal, the low-frequency determination signal, the ultra-high frequency determination signal, and the random frequency determination signal indicating that the selection clock signal exhibits an abnormal frequency.

* * * * *